(12) United States Patent
Moreno et al.

(10) Patent No.: US 11,929,308 B2
(45) Date of Patent: Mar. 12, 2024

(54) FLIP CHIP PACKAGE ASSEMBLY

(71) Applicant: Texas Instruments Incorporated, Dallas, TX (US)

(72) Inventors: Steffany Ann Lacierda Moreno, Bamban (PH); John Carlo Cruz Molina, Bataab (PH); Rafael Jose Lizares Guevara, Manila (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 153 days.

(21) Appl. No.: 17/515,369

(22) Filed: Oct. 29, 2021

(65) Prior Publication Data
US 2023/0137852 A1 May 4, 2023

(51) Int. Cl.
*H01L 23/495* (2006.01)
*H01L 21/48* (2006.01)
*H01L 21/56* (2006.01)
*H01L 23/00* (2006.01)

(52) U.S. Cl.
CPC .... *H01L 23/49548* (2013.01); *H01L 21/4842* (2013.01); *H01L 21/565* (2013.01); *H01L 24/03* (2013.01); *H01L 24/05* (2013.01); *H01L 24/11* (2013.01); *H01L 24/13* (2013.01); *H01L 24/16* (2013.01); *H01L 24/81* (2013.01); *H01L 24/96* (2013.01); *H01L 24/97* (2013.01); *H01L 2224/0401* (2013.01); *H01L 2224/1131* (2013.01); *H01L 2224/13144* (2013.01); *H01L 2224/13147* (2013.01); *H01L 2224/16245* (2013.01); *H01L 2224/81815* (2013.01); *H01L 2924/3841* (2013.01)

(58) Field of Classification Search
CPC .......... H01L 23/49548; H01L 21/4842; H01L 21/565; H01L 24/03; H01L 24/05; H01L 24/11; H01L 24/13; H01L 24/16; H01L 24/81; H01L 24/96; H01L 24/97; H01L 2224/0401; H01L 2224/1131; H01L 2224/13144; H01L 2224/13147; H01L 2224/16245; H01L 2224/81815; H01L 2924/3841
See application file for complete search history.

(56) References Cited

U.S. PATENT DOCUMENTS

| | | | |
|---|---|---|---|
| 7,964,450 B2 * | 6/2011 | Camacho | H01L 24/05 257/E23.021 |
| 10,593,640 B2 | 3/2020 | Baello et al. | |
| 11,637,083 B2 * | 4/2023 | Guevara | H01L 21/561 257/737 |
| 2015/0069605 A1 * | 3/2015 | Lin | H01L 24/13 257/737 |
| 2022/0122940 A1 * | 4/2022 | Baello | H01L 23/49816 |
| 2022/0210911 A1 * | 6/2022 | Luo | H01L 23/5385 |
| 2022/0319961 A1 * | 10/2022 | Guevara | H01L 24/11 |

(Continued)

*Primary Examiner* — Douglas W Owens
(74) *Attorney, Agent, or Firm* — Dawn Jos; Frank D. Cimino

(57) ABSTRACT

In a described example, an apparatus includes: a package substrate for mounting a semiconductor die to a die side surface, the package substrate including leads spaced from one another; and cavities extending into the leads from the die side surface, the cavities having sides and a bottom surface of the lead material, the cavities at locations corresponding to post connect locations on the semiconductor die.

24 Claims, 12 Drawing Sheets

(56) References Cited

U.S. PATENT DOCUMENTS

| | | | |
|---|---|---|---|
| 2022/0320038 A1* | 10/2022 | Guevara | H01L 21/561 |
| 2023/0057439 A1* | 2/2023 | Chen | H01L 24/11 |
| 2023/0104156 A1* | 4/2023 | Timbol | H01L 24/04 |
| | | | 257/666 |

* cited by examiner

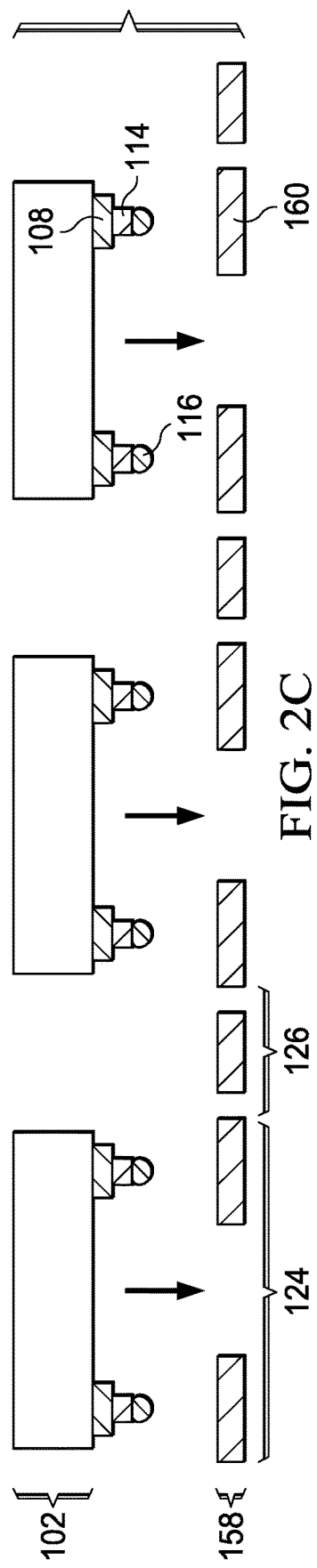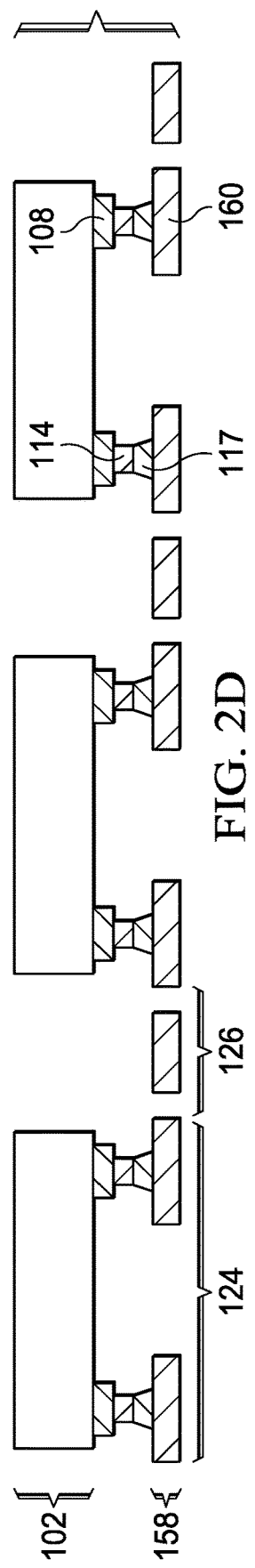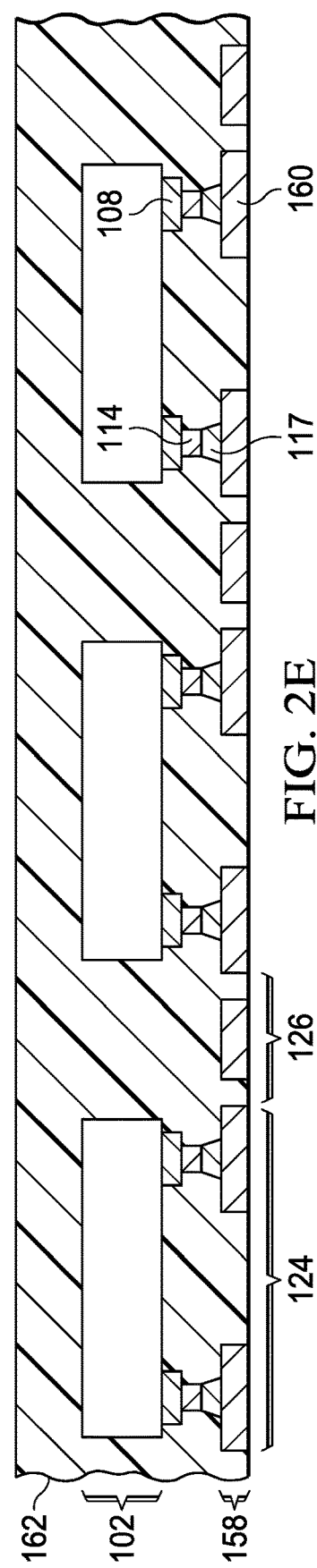

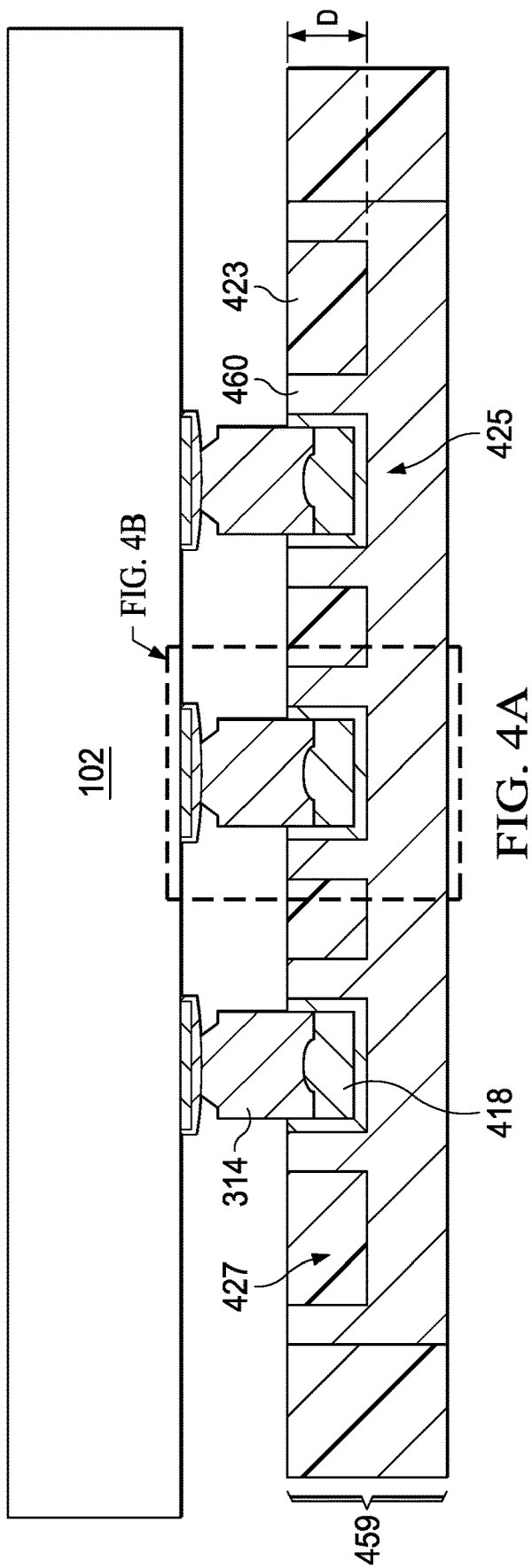

FLIP CHIP PACKAGE ASSEMBLY

TECHNICAL FIELD

This relates generally to packaging electronic devices, and more particularly to assembling flip chip packaged semiconductor devices.

BACKGROUND

Processes for producing packaged semiconductor devices include mounting the electronic devices to a package substrate, and then covering the electronic devices with a mold compound in a molding process to form packages. When devices are mounted on package substrates in flip chip packages, a semiconductor die has post connects that extend from a proximal end placed on bond pads on a device side surface of the semiconductor die to a distal end having a solder ball or solder bump. In a flip chip package, the semiconductor die is mounted with the device side surface facing a package substrate. When the semiconductor die is flip chip mounted to the package substrate, the solder bumps at the distal end of the post connects are subjected to a thermal reflow process so that the solder melts and flows to form solder joints. The solder joints mechanically attach and electrically couple the semiconductor die to the package substrate. The solder joints attach the conductive post connects to conductive areas on the package substrate.

As the size and number of connections increase, and as semiconductor dies decrease in size, the pitch distance between the conductive post connects decreases. In some example flip chip packaging processes, solder bridges, or shorts, may occur when the semiconductor die is mounted to the package substrate by solder reflow. These bridges form shorts in the semiconductor device package. Die tilt defects can occur during solder reflow when a bond line thickness (the thickness of the bond between the post connect and the package substrate) is not uniform across the semiconductor die, causing a tilt or non-level position in the semiconductor die. Die tilt can cause opens or voids in the solder joints and even failures or scrapping of devices identified during testing. A flip chip package assembly method with reliable solder joints is needed.

SUMMARY

In a described example, In a described example, an apparatus includes: a package substrate for mounting a semiconductor die to a die side surface, the package substrate including leads spaced from one another; and cavities extending into the leads from the die side surface, the cavities having sides and a bottom surface of the lead material, the cavities at locations corresponding to post connect locations on the semiconductor die.

Another example includes a package substrate having a die side surface and an opposing board side surface; leads in the package substrate spaced from one another; cavities extending into the leads from the die side surface of the leads in the package substrate, the cavities having sides and a bottom surface of the lead material; and a semiconductor die flip chip mounted to the die side surface of the package substrate, the semiconductor die including post connects extending from bond pads on a device side of the semiconductor die, the post connects on the bond pads at a proximal end and extending to a distal end spaced from the bond pads, the post connects bonded to the leads on the package substrate by solder joints formed in the cavities.

Yet another example includes a method of manufacturing a semiconductor package, including forming bond pads over a device side surface of a semiconductor die; performing a plating process to form post connects having proximate ends on the bond pads, and extending away from the bond pad to distal ends; forming solder bumps on the distal ends of the post connects; flip chip mounting the semiconductor die to a die side surface of a package substrate by bringing the solder bumps on the distal ends of the post connects into cavities extending into the die side surface of the package substrate; and performing a thermal reflow to form solder joints between the post connects and the cavities in the package substrate.

BRIEF DESCRIPTION OF THE DRAWINGS

FIGS. 4A-4B illustrate in cross sectional views a portion of an flip chip semiconductor package including a package substrate of an arrangement, and a close up view of a post connect and solder joint to a package substrate of an arrangement.

DETAILED DESCRIPTION

Figure 1:
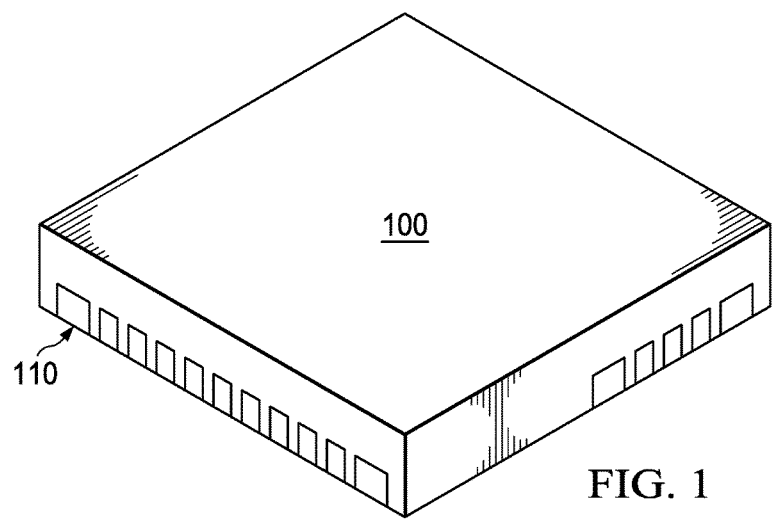
FIG. 1 is a projection view of a flip chip packaged electronic device in a quad flat no-leads (QFN) package.

Corresponding numerals and symbols in the different figures generally refer to corresponding parts, unless otherwise indicated. The figures are not necessarily drawn to scale.

Elements are described herein as "coupled." The term "coupled" includes elements that are directly connected and elements that are indirectly connected, and elements that are electrically connected even with intervening elements or wires are coupled.

The term "semiconductor die" is used herein. As used herein, a semiconductor die can be a discrete semiconductor device such as a bipolar transistor, a few discrete devices such as a pair of power FET switches fabricated together on a single semiconductor die, or a semiconductor die can be an integrated circuit with multiple semiconductor devices such as the multiple capacitors in an A/D converter. The semiconductor die can include passive devices such as resistors, inductors, filters, or active devices such as transistors. The semiconductor die can be an integrated circuit with hundreds or thousands of transistors coupled to form a functional circuit, for example a microprocessor or memory device. The semiconductor die can be a passive device such as a sensor, example sensors include photocells, transducers, and charge coupled devices (CCDs), or can be a micro electro-mechanical system (MEMS) device, such as a digital micro-mirror device (DMD). The semiconductor die includes a semiconductor substrate that has a device side surface and an opposite backside surface. Semiconductor processes form devices on the device side surface of the semiconductor die.

The term "packaged electronic device" is used herein. A packaged electronic device has at least one semiconductor die electronically coupled to terminals and has a package body that protects and covers the semiconductor die. In some arrangements, multiple semiconductor dies can be packaged together. For example, a power metal oxide semiconductor (MOS) field effect transistor (FET) semiconductor die and a logic semiconductor die (such as a gate driver die or controller device die) can be packaged together to from a single packaged electronic device. Additional components such as passives can be included in the packaged electronic device. The semiconductor die is mounted to a package substrate that provides conductive leads, a portion of the conductive leads form the terminals for the packaged electronic device. The semiconductor die can be flip chip mounted with the device side surface facing a package substrate surface, and the semiconductor die mounted to the leads of the package substrate by conductive post connects attached to the package substrate by solder such as solder balls or bumps. The packaged electronic device can have a package body formed by a thermoset epoxy resin in a molding process, or by the use of epoxy, plastics, or resins that are liquid at room temperature and are subsequently cured. The package body may provide a hermetic package for the packaged electronic device. The package body may be formed in a mold using an encapsulation process, however, a portion of the leads of the package substrate are not covered during encapsulation, these exposed lead portions provide the exposed terminals for the packaged electronic device.

The term "package substrate" is used herein. A package substrate is a substrate arranged to receive a semiconductor die and to support the semiconductor die in a completed semiconductor package. Package substrates include conductive lead frames, which can be formed from copper, aluminum, stainless steel and alloys such as Alloy 42 and copper alloys. For flip chip packages, a portion of the leads are configured to receive solder joints between the leads and the conductive post connects for the semiconductor die. The solder joints form the physical die attach and the electrical connection to the package substrate. When lead frames are used as package substrates, the lead frames can be provided in strips or arrays. Dies can be placed on the strips or arrays, the dies flip chip mounted to the lead frames and the lead frames and dies then covered with mold compound in a molding process.

Alternative package substrates include pre-molded lead frames (PMLF) and molded interconnect substrates (MIS) for receiving semiconductor dies. Routable lead frames, which include multiple levels of conductors in dielectric material, can be used. These package substrates can include dielectrics such as liquid crystal polymer (LCP) or mold compound, and can include one or more layers of conductive portions in the dielectrics. Repeated plating and patterning can form multiple layers of conductors spaced by dielectrics, and conductive vias connecting the conductor layers through the dielectrics, the dielectrics can be mold compound. The package substrates can include lead frames, and can include plated, stamped and partially etched lead frames. In a partially etched lead frame, two levels of metal can be formed by etching a pattern from one side of a metal substrate configured for lead frames, and then etching from the other side, to form full thickness and partial thickness portions, and in some areas, all of the metal can be etched through to form openings through the partial etch lead frames. The package substrate can also be tape-based and film-based, and these can form substrates carrying conductors. Ceramic substrates, laminate substrates with multiple layers of conductors and insulator layers; and printed circuit board substrates of ceramic, fiberglass or resin, or glass reinforced epoxy substrates such as flame retardant 4 (FR4) can be used as the package substrates.

The term "post connect" is used herein. As used herein, a post connect is a structure made of a conductive material, for example copper or copper alloys, gold or gold alloys, or combinations of conductive metal that provides a connection between a semiconductor die and a package substrate. A proximal end of the post connects is mounted to a bond pad on the device side surface of a semiconductor die, while a distal end of the post connect is extended away from the bond pad of the semiconductor die. When the packaged semiconductor device is oriented with the semiconductor die positioned above and facing a die mount surface of a package substrate in a flip chip orientation, the post connect makes a vertical connection between a conductive portion of the package substrate and the bond pad of the semiconductor die. Some references describe a type of post connect as a "controlled collapse chip connection" or as "C4" bumps. The conductive post connect includes a post of conductor material and has a distal end facing away from the surface of the bond pad on the semiconductor die, where a proximal end of the post connect is mounted to the bond pad. In the arrangements, the solder at the distal end of the post connects is positioned in a corresponding cavity in a package substrate, and the solder joints form in a thermal reflow with the solder contained in the cavities. Because the solder joints are formed in a cavity with a volume sufficient to contain the solder joint, the solder joints do not form solder bridges or shorts, even when the spacing between the post connects is reduced and density is increased. The bond line thickness (BLT) of the solder bonds is controlled by the size of the cavities, reducing or eliminating die tilt or die angle problems that can occur without use of the arrangements.

A package substrate, such as a lead frame, partially etched lead frame, MIS, or PMLF package substrate, has conductive portions on a planar die side surface. Leads of a metal lead frame are conductive all along the surfaces, while for other substrate types, conductive lands in dielectric substrate material are arranged and aligned to electrically and mechanically connect to the conductive post connects. The post connects can extend along the same direction as a conductive lead in the package substrate, so that the post connect appears as a rail or has a rectangular cross section. When the post connect is copper and is pillar shaped and has solder bumped at the end, it may be referred to as a "copper pillar bump." A copper pillar bump or copper bump is therefore an example of a post connect. In addition to the pillar shape, the post connect can also be a column, rectangle or rail shape, and can have an oval, round, square or rectangular cross section. In examples, multiple post connects can be arranged in parallel to one another with additional post connects coupled to a common trace on a package substrate, to provide a low resistance path between the semiconductor die and the package substrate. The post connects can also transfer thermal energy away from the semiconductor die to a package substrate and out of the package. A thermal reflow process is used to melt solder between the post connect and the package substrate to make a solder joint. The solder joint provides both a mechanical attachment and an electrical connection between the semiconductor die and the package substrate. Post connects are used to form several, tens, hundreds or thousands of connections between a semiconductor die and a package substrate in fine pitch semiconductor packages. In a discrete device or power transistor package, only a few post connects may be used. The conductive post connects can be, in some examples, a uniform size and have uniform or minimum pitch between them. In other examples, the size of the post connects can be made larger for power terminals or for high current signals, and smaller for control signals or logic signals that require less current, and may have varying spacing distances. Multiple post connects can be coupled in parallel to reduce resistance for certain signals, such as a high current signal, power or ground signal. Post connects can vary in size and shape, but in examples range from 10-70 microns in diameter, and may range from 20-50 microns in height extending away from the bond pad surface on the semiconductor die. As device sizes continue to fall and the density of connections rises, these sizes may decrease. Spacing between post connects may also decrease. In the arrangements, the package substrate can be a metal lead frame, and positions on the metal lead frame that correspond to post connect positions on a semiconductor die are prepared prior to packaging by forming cavities extending into the metal lead frame at those locations. In an example process, a laser ablation tool forms the cavities. When the solder at the distal ends of the post connects is positioned during die mounting on the package substrate, the solder is placed in the cavities, and then the thermal reflow process melts the solder to form solder joints. Because the solder joints are formed within the cavities extending into the package substrate, the solder does not form solder bridges, and the thickness of the resulting solder joints is controlled by the use of the arrangements, preventing die tilt problems. In another arrangement, a PMLF is used, and the cavities are formed in conductive portions of the PMLF at locations where the post connects will be bonded to the PMLF by the solder joints. Other package substrates can be used with the arrangements. The cavities can be formed by laser ablation, or by a punch or etch operation on a metal substrate.

In packaging semiconductor devices, a mold compound may be used to partially cover a package substrate, to cover the semiconductor die, and to cover the connections from the semiconductor die to the package substrate. This "encapsulation" process is often an injection molding process, where thermoset mold compound such as epoxy resin can be used. A room temperature solid or powder mold compound can be heated to a liquid state and then molding can be performed. Transfer molding can be used. Unit molds shaped to surround an individual device may be used, or block molding may be used, to form the packages simultaneously for several devices using molten mold compound. The devices can be provided in an array of several, hundreds or even thousands of devices in rows and columns that are molded together. After the molding, the individual packaged devices are cut from each other in a sawing operation by cutting through the mold compound and package substrate in saw streets formed between the devices. Portions of the package substrate leads are exposed from the mold compound package to form terminals for the packaged semiconductor device.

In flip chip die attach processes, solder balls, solder columns, or solder bumps are used to form solder joints between the conductive post connects and a conductive lead or land on a package substrate. The post connects are formed extending from bond pads of the semiconductor die. The semiconductor die is then oriented with the distal ends of the post connects facing a die mounting surface of a circuit board or package substrate. A solder reflow process is used to attach the post connects to conductive die pads or leads on the package substrate, the solder joints forming a physical attachment and an electrical connection between the package substrate and the semiconductor die.

The term "scribe lane" is used herein. A scribe lane is a portion of semiconductor wafer between semiconductor dies. Sometimes in related literature the term "scribe street" is used. Once semiconductor processing is finished and the semiconductor devices are complete, the semiconductor devices are separated into individual semiconductor dies by severing the semiconductor wafer along the scribe lanes. The separated dies can then be removed and handled individually for further processing including packaging. This process of removing dies from a wafer is referred to as "singulation" or sometimes referred to as "dicing." Scribe lanes are arranged on four sides of semiconductor dies and when the dies are singulated from one another, rectangular semiconductor dies are formed.

The term "saw street" is used herein. A saw street is an area between molded electronic devices used to allow a saw, such as a mechanical blade, laser or other cutting tool to pass between the molded electronic devices to separate the devices from one another. This process is another form of singulation. When the molded electronic devices are provided in a strip with one device adjacent another device along the strip, the saw streets are parallel and normal to the length of the strip. When the molded electronic devices are provided in an array of devices in rows and columns, the saw streets include two groups of parallel saw streets, the two groups are normal to each other and so the saw will traverse the molded electronic devices in two different directions to cut apart the packaged electronic devices from one another in the array.

The term "quad flat no-lead" or "QFN" is used herein for a type of electronic device package. A QFN package has conductive leads that are coextensive with the sides of a molded package body and the leads are on four sides. Alternative flat no-lead packages may have leads on two sides or only on one side. These can be referred to as "small outline no-lead" or "SON" packages. No lead packaged electronic devices can be surface mounted to a board. Leaded packages can be used with the arrangements where the leads extend away from the package body and are shaped to form a portion for soldering to a board. A dual in line package, or DIP, can be used with the arrangements. A small outline package or SOP can be used with the arrangements.

In the arrangements, a semiconductor die has post connects mounted with a proximate end on bond pads on a device side surface of the semiconductor die, and having solder balls on a distal end of the post connects. Solder is formed on the distal ends of the post connects. When the semiconductor die is flip chip mounted to a package substrate by a solder reflow process, the solder joints are formed in cavities formed on the package substrate at locations that correspond to the post connects on the semiconductor die. The packaged semiconductor devices formed with the arrangements have increased reliability and increased performance. The arrangements require an extra step in the production of the package substrate by forming the cavities.

The semiconductor die, the post connects and the solder deposition on the post connects do not need to be modified from conventional approaches to use the arrangements. The methods and materials used in the arrangements do not require changes or retooling of any tools, and no additional materials are used, so the arrangements can be easily implemented.

FIG. 1 illustrates a packaged electronic device 100 in a quad flat no lead (QFN) package. The packaged electronic device can have a body formed from a thermoset mold compound, such as epoxy resin. Other mold compounds, such as resins, epoxies, or plastics can be used. Leads 110 are part of a package substrate that supports a semiconductor die (not visible in FIG. 1, as it is obscured by the package body) within the package, the leads 110 are exposed from the mold compound and form electrical terminals for the packaged electronic device. The packaged electronic device 100 can be mounted to a circuit board using surface mount technology (SMT). Package sizes for packaged electronic devices are continually decreasing, and currently can be several millimeters on a side to less than one millimeter on a side, although larger and smaller sizes are also used. Future package sizes may be smaller. The number of terminals 110 is increasing with additional integration of circuitry on semiconductor dies.

Figure 2B:
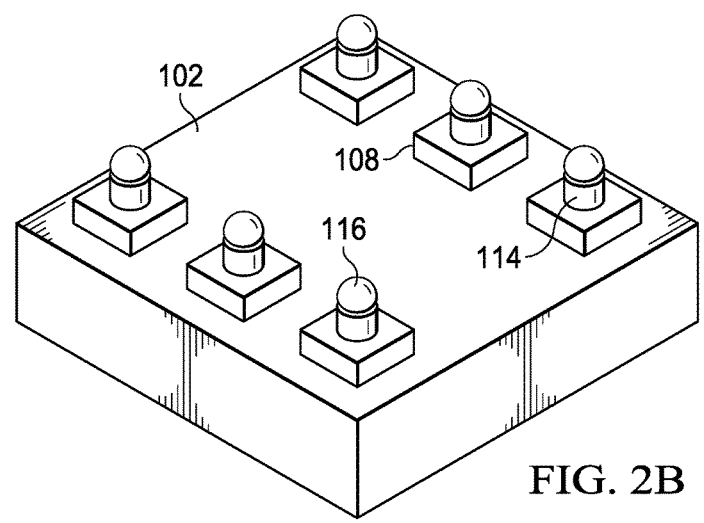
FIGS. 2A-2B illustrate in projection views a semiconductor wafer with semiconductor dies, and a single semiconductor die, respectively, having post connects on bond pads.
Figure 2A:
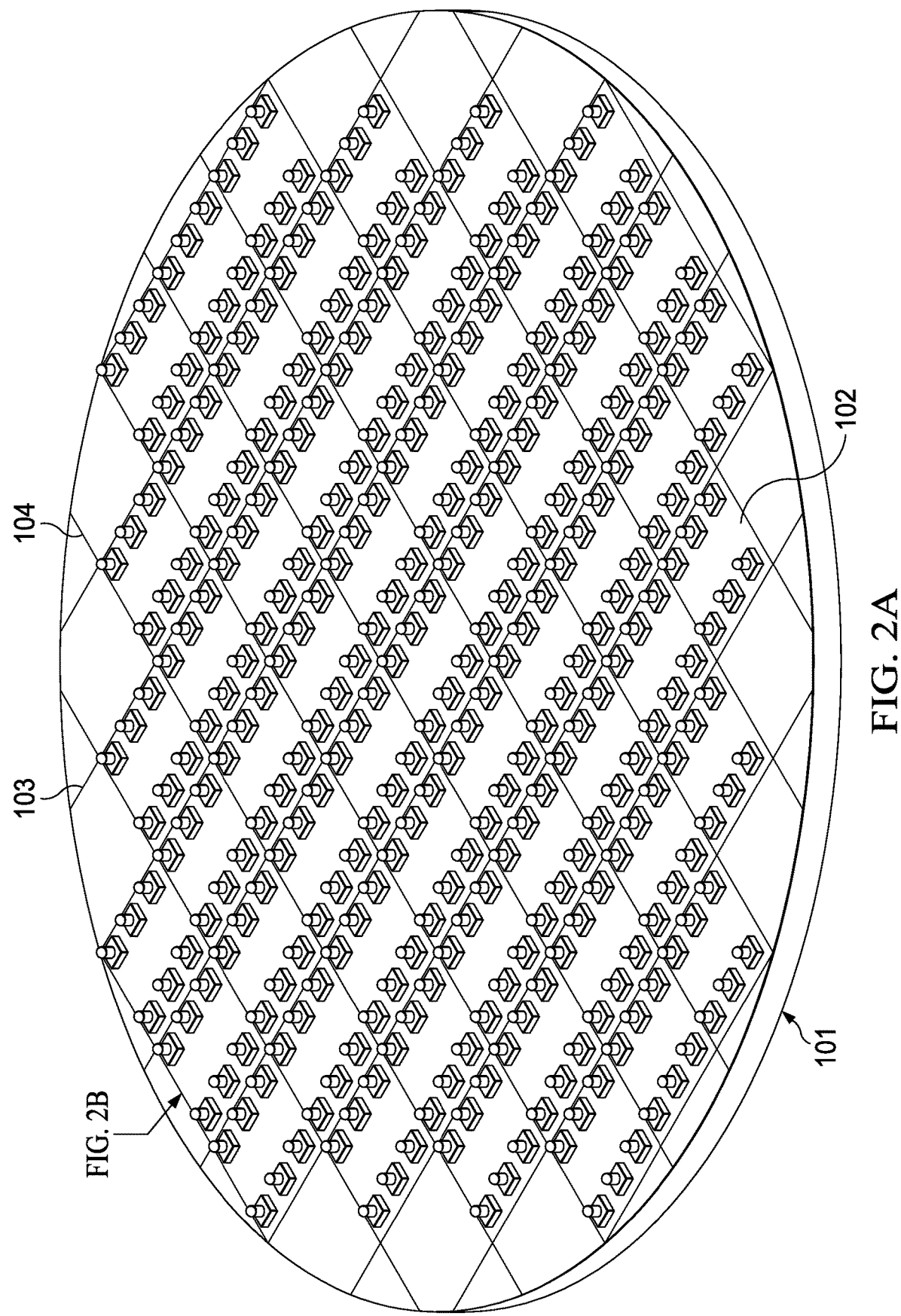

FIGS. 2A-2F illustrate in a series of steps a method for forming flip chip packaged electronic devices using solder bumps on post connects. Because the semiconductor dies are mounted directly to leads, the packaged devices can be referred to as "flip chip on lead" or "FCOL" packages. In FIG. 2A, a semiconductor wafer 101 is shown with an array of semiconductor dies 102 in rows and columns formed on an active surface. The semiconductor dies 102 are formed using processes in a semiconductor manufacturing facility, including ion implant doping, anneal, oxidation, dielectric and metal deposition, photolithography, pattern, etch, chemical mechanical polishing (CMP), electroplating, and other processes for making semiconductor devices. Vertical and horizontal (as the wafer is oriented in FIG. 2A) scribe lanes 103 and 104, which are perpendicular to one another and which run in parallel groups across the wafer, separate the rows and columns of the completed semiconductor dies, and provide areas for dicing the wafer to separate the semiconductor dies 102 from one another.

FIG. 2B illustrates a single semiconductor die 102, with bond pads 108, which are conductive pads that are electrically coupled to devices formed in the semiconductor die 102. Conductive post connects 114 are shown extending away from a proximate end mounted on the bond pads 108 on the active surface of semiconductor die 102, and solder bumps 116 are formed on the distal ends of the conductive post connects 114. The conductive post connects can be formed by electroless or electroplating. In an example, the conductive post connects are copper pillar bumps. Copper pillar bumps can be formed by sputtering a seed layer over the surface of the semiconductor wafer 101, forming a photoresist layer over the seed layer, using photolithography to expose the bond pads 108 in openings in the layer of photoresist, plating the copper conducive post connects 114 on the bond pads, and plating a lead solder or a lead-free solder such as an tin, silver (SnAg) or tin, silver, copper (SnAgCu) ("SAC") solder to form solder bumps 116 on the copper conductive post connects 114. Other conductive materials can be used for the conductive post connects in an electroplating or electroless plating operation, including silver, nickel, palladium, or tin, for example. Not shown for clarity of illustration are under bump metallization (UBM) which can be formed over the bond pads to improve plating and adhesion between the conductive post connects and the bond pads 108. After the plating operations, the photoresist is then stripped, and the excess seed layer is etched from the surface of the wafer. The semiconductor dies are then separated by dicing, or are singulated, using the scribe lanes 103, 104 (see FIG. 2A).

FIG. 2C shows in a cross sectional view semiconductor dies 102 after the semiconductor dies 102 have been singulated from the semiconductor wafer 101 with bond pads 108, post connects 114 and solder bumps 116. Solder bumps 116 can be shaped in a thermal reflow process of columnar plated solder to form solder bumps. Solder bumps 116 can be formed using a solder ball drop process, where solder balls are picked up using a vacuum head with an alignment pattern that corresponds to the post connects 114, the solder balls are placed on the ends of the post connects 114, and then the solder balls shaped in a thermal reflow process that bonds the solder balls to the post connects, forming solder bumps 116. The semiconductor dies 102 are flip chip oriented, with a device side surface of the semiconductor dies placed facing a die mounting surface of a package substrate 158. In the illustrated example, the package substrate 158 is a conductive lead frame. Each unit lead frame 124 in a strip or array is spaced from an adjacent unit lead frame by a saw street 126. The lead frames have a conductive surface and may include plated areas (not shown) to receive the solder bumps, or the solder bumps may be soldered directly to the lead frame surface in designated positions. Example plating layers include gold, nickel, palladium, platinum, electroless nickel, immersion gold, electroless palladium, and combinations like ENIG (electroless nickel immersion gold) and ENEPIG (electroless nickel, electroless palladium, immersion gold) that are used to improve solderability and reduce diffusion can be used at the solder joint positions.

In FIG. 2D, a cross sectional view shows the singulated dies 102 after mounting on the die pads 160 on the conductive lead frame by solder joints 117 formed using solder bumps 116 (see FIG. 2C) on the conductive post connects 114. A thermal reflow process may be used to melt the solder bumps 116 and form the solder joints between the post connects 114 and the package substrate 158. The solder joints 117 provide both mechanical attachment and electrical connection between the semiconductor die 102 and the package substrate 158.

FIG. 2E is another cross sectional view that shows the semiconductor dies 102 with bond pads 108, conductive post connects 114 and solder joints 117 after an encapsulation molding process covers the semiconductor devices and portions of the package substrate 158 with a mold compound 162. The semiconductor dies 102, the solder joints 117, the conductive post connects 114, and portions of the package substrate 158 are shown covered with a mold compound 162. The mold compound 162 may be a filled resin epoxy. The mold compound 162 can be subjected to a thermal cure or can be a thermoset mold compound, heated to liquefy it, and then dispensed in a transfer mold as a heated liquid that cures and solidifies as it cools. Other mold compounds and materials such as plastics, resins, or epoxies can be used. Saw streets 126 separate the molded devices from each other between unit lead frames 124.

Figure 2F:
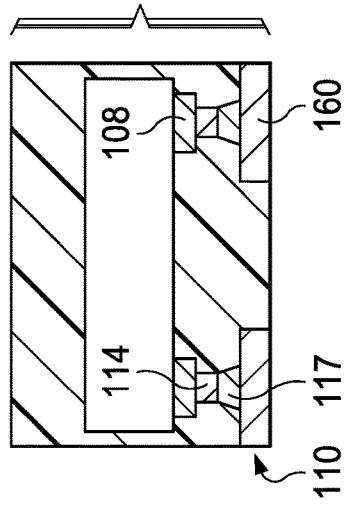
FIGS. 2C-2F illustrate, in cross sectional views, steps in forming flip chip packaged devices, FIG. 2G illustrate in a cross sectional view, an example of a flip chip packaged device having solder bridges and die tilt problems.
Figure 2F:
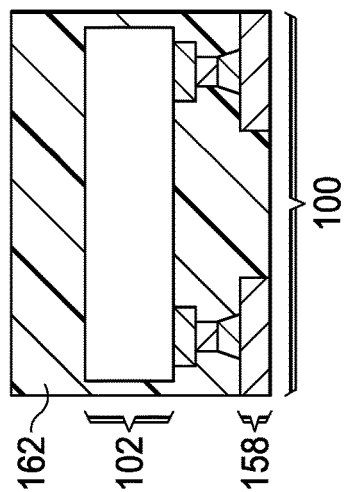

In FIG. 2F, a cross sectional view shows individual packaged semiconductor dies 100 after the devices have been singulated one from another by cutting through the saw streets 126 on the package substrate 158. Each packaged semiconductor device 100 has a package body of mold compound 162, leads 110 that are partially covered by the mold compound 162 and with portions exposed from the mold compound 162 to form terminals for the packaged semiconductor device.

Figure 2G:
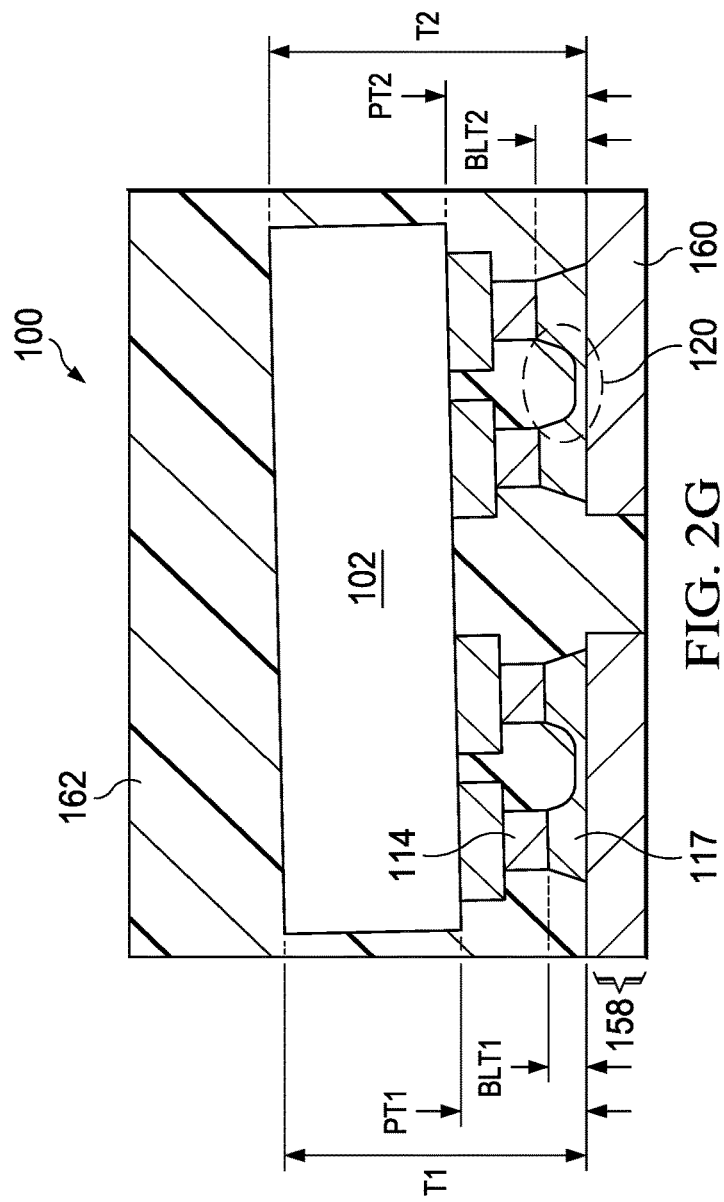

As shown in FIGS. 2D-2F, the solder joints are formed on the surface of the package substrate 158 because during solder reflow, the solder melts in a liquid state, and then cools and hardens. FIG. 2G illustrates an example semiconductor package 100 used to show some problems that occur in assembling flip chip packages. In FIG. 2G, a mold compound 162 covers a semiconductor die 102, with post connects 114 and solder joints 117 joining the post connects to leads 160 of a package substrate 158. As shown in FIG. 2G, in an example with the post connects 114 positioned close to one another, solder bridges (see area 120 in FIG. 2G) can form between solder joints 117. A solder bridge is a conductive path and can become a short in the packaged semiconductor device. The solder joints may also have non-uniform thickness as shown in FIG. 2G, which can cause the semiconductor dies 102 to tilt, and can lead to an incomplete solder joint between a post connect and the package substrate 158.

In FIG. 2G, the thickness T1, between the surface of the package substrate 158 and the top of the die 102 on the left side of the cross section, was 203.1 microns. The thickness T2, measured at the right side of the cross section, was 204.9 microns. The bond line thickness BLT1 measured at the left side of the cross section was 51.9 microns, while the bond line thickness BLT2 measured at the right side of the cross section was 53.7 microns. Using these measurements it can be seen that the die 102 is tilted, the top surface of the die 102 at the right side of the cross section is tilted away from the package substrate, so that the solder joints have non-uniform thickness. If the semiconductor die tilt is large enough, incomplete solder joints may form. Incomplete solder joints can become an open in the packaged semiconductor device, causing a scrapped device. The semiconductor dies may also move after initial positioning of the semiconductor die and before the solder joints are formed. Die misalignment can occur, resulting in poor or misplaced solder joints between the post connects and the package substrate.

Figure 3A:
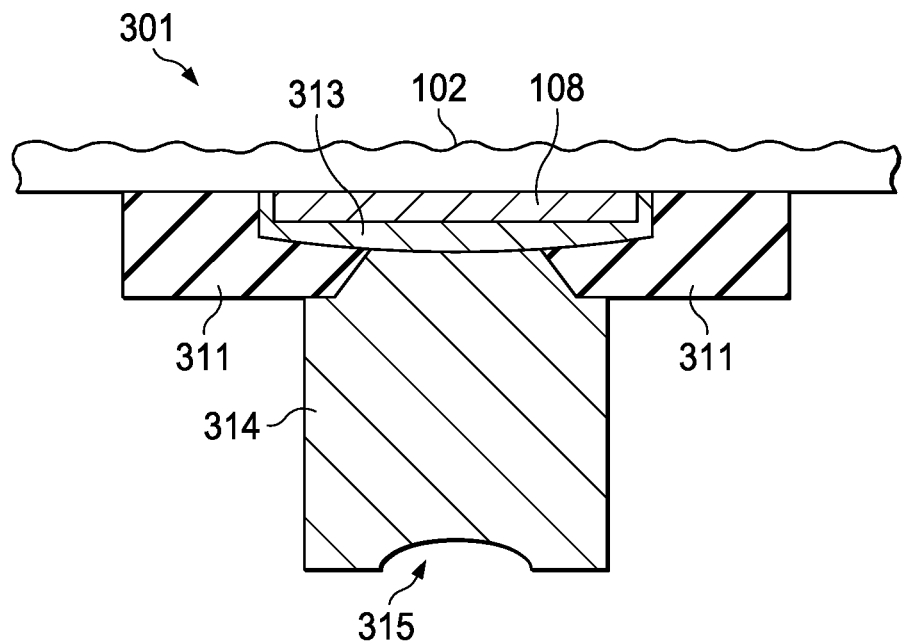
FIGS. 3A-3C illustrate in cross sectional views details of post connects.
Figure 3B:
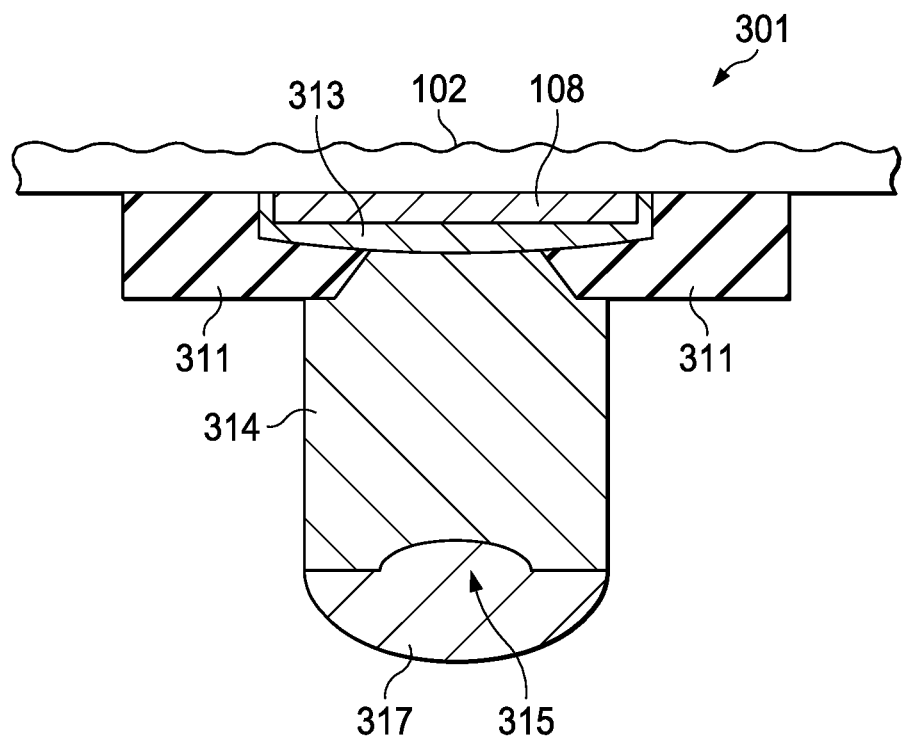
Figure 3C:
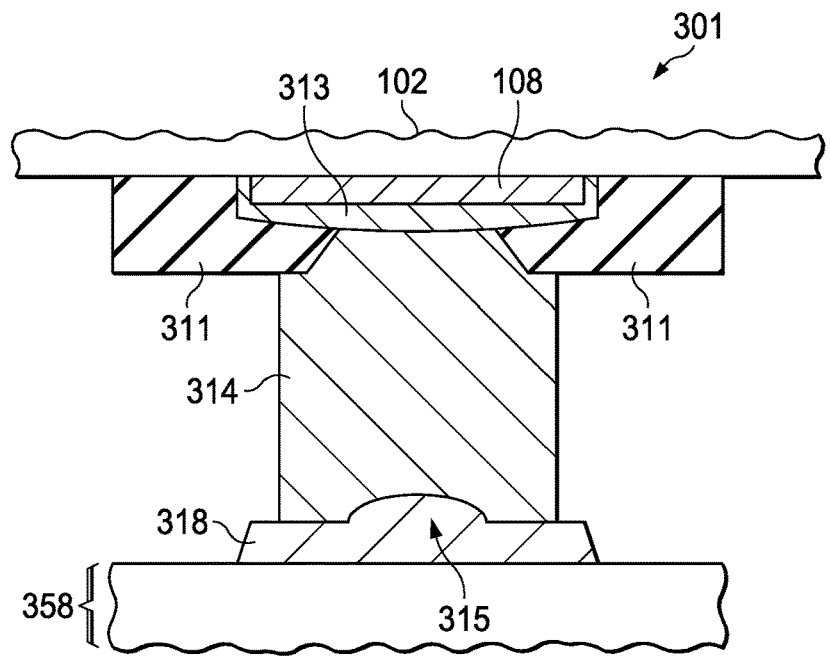

FIGS. 3A-3C illustrate, in cross-sectional views, additional details of example post connects. In FIG. 3A, semiconductor substrate 102 has a bond pad 108 on a surface. Aluminum and copper bond pads can be used, increasingly semiconductor processes use copper for metallization in manufacturing semiconductor devices and for bond pads. A process for forming a top metal layer of copper can be used, sometimes referred to as "copper over anything" or COA. Passivation dielectric materials which can be of several layers, are formed over the surface of the substrate and surrounding the bond pad 108, and partially overlying the bond pad 108. This layer 311 may be a polyimide material and is sometimes referred to as a "PI" layer. An under bump metallization (UBM) 313 is formed on the bond pad 108. UBM materials are chosen to form diffusion barriers, increase adhesion and improve the reliability of the conductive post connects, and to provide a low resistance electrical path between the bond pad 108 and the post connects. The PI layer 311 is opened in a photolithographic process to expose the surface of the bond pad and the UBM. To form the post connect 314, a plating process can be used. A seed layer for plating can be deposited by sputtering, for example, and then patterned over the UBM 313. Electroless or electroplating can be used to deposit a layer of the metal for the post connect 314 on the seed layer. The post connect can be gold, copper, or combinations or alloys of these. The post connect material will plate onto the exposed seed layer, and thus form posts, rails, or columns depending on the seed layer pattern. In an example where the post connects are copper and are round columns or are oval shapes in cross section, the post connects are sometimes referred to as "copper pillars". However, gold and other materials can be used. An inherent "dished" feature typically forms when plating the post connects due to dishing during plating, forming dished feature 315, where the center portion of the distal end of the post connects has an indentation or convex feature. This occurs because the seed layer or UBM layer is lying over the bond pad and over the PI layer 311, so that it falls into the opening in the PI layer 311 to cover the bond pad 108. The post connect 314 has a proximal end that is attached to the semiconductor substrate 102 at the bond pad 108, and a distal end that extends away from the semiconductor substrate 102, and which has the dished feature 315. The distal end of post connect 314 will be have solder formed on it, the solder will be used for mounting the semiconductor die 102 to a package substrate.

FIG. 3B illustrates in a cross sectional view the post connect 314 including a solder bump 317. In FIG. 3B, after the distal end of the post connect 314 is completed as in FIG. 3A, a solder ball drop process places a solder ball at the distal end of the post connect 314, and the solder ball is then subjected to a thermal reflow to form solder bump 317. As an alternative approach, a solder plating process can be used to form solder bump 317 on the distal end of the post connect 314.

When the post connect 314 of FIG. 3B is used in a flip chip mounting operation, a solder joint is formed by another thermal reflow process that melts the solder bump 317 onto a conductive pad on a package substrate.

FIG. 3C illustrates in another cross section the post connect 314 after the semiconductor die 102 is mounted to a package substrate 358. In FIG. 3C, the solder bump 317 of FIG. 3B is shown after a reflow process forms a solder joint 318 coupling the distal end of the post connect 314 to the package substrate 358. If another solder joint is formed close to the post connect 314, as is increasingly likely as the density of the post connects increases and semiconductor die size decreases, solder bridges can form between the post connects. The surface of the package substrate 358 is a smooth surface, so that the die may move when placed, and may become misaligned. The solder joints 318 that forms between the package substrate 358 and the post connect 314 may have non-uniform thickness, causing die tilt and voids or opens in the solder joints.

Figure 4B:
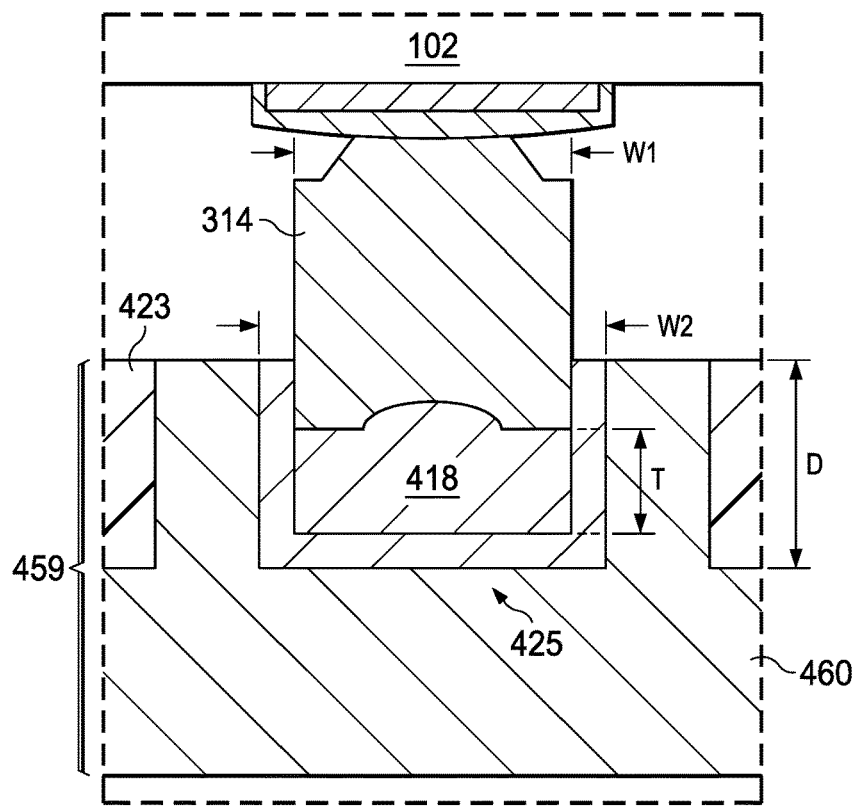

FIGS. 4A-4B illustrate, in cross sectional views, a portion of the package substrate, and a close up of a post connect, cavity, and solder joint, of the arrangements. FIG. 4A illustrates, in a cross sectional view, a portion of a semiconductor die that is flip chip mounted using a package substrate of the arrangements, In FIG. 4A, semiconductor die 102 has post connects 314 formed on a device side surface of the semiconductor die, which is oriented facing a die mount surface of a package substrate 459. In this example the package substrate 459 is a pre-molded lead frame (PMLF). Mold compound 423 is deposited on the lead frame filling spaced between conductive leads prior to mounting the semiconductor die 102 on the PMLF, and this pre-mold mold compound 423 may be deposited when the package substrate 459 is manufactured. When the semiconductor die 102 is positioned on the package substrate 459, the semiconductor die 102 is placed so that the post connects 314 meet and extend into cavities 425 that extend from a die mounting surface of the package substrate 459 into the package substrate a sufficient depth D so that the solder joints 418 are contained within the cavities 425. Solder joints 418 are formed in the cavities 425 and bond to the bottoms and sides of cavities 425, which are conductive portions of leads of the package substrate 459, so that the post connects 314 are electrically coupled and mechanically bonded to the package substrate 459 by solder joints 425. The example PMLF is stiffened with mold compound 423 deposited in recesses between the cavities 427 to stiffen the package substrate 459. The cavities 425 and 427 may be formed using laser ablation, or by mechanical drilling on the die side surface of the package substrate. In a laser ablation process, a pulsed laser is focused on designate spots on the die side surface of a package substrate, which can be a metal lead frame, PMLF, or a partially etched lead frame, and focused laser energy is applied in pulses to remove the material. The cavities 425 in an example process have a minimum depth of 35 microns, although the depth D of the cavities can vary with the volume of the solder used to form the solder bumps. The depth D and the size of the cavities is sufficiently large to allow the insertion of the post connects 314 and the solder bumps 317 (see FIG. 3B) into the cavities 425. The cavities have vertical sides and a bottom surface of the conductive material of the package substrate, such as copper, and liner materials can be used in the cavities. Because the post connects 314 are positioned in the cavities 425 prior to the thermal reflow step, use of the arrangements eliminates or greatly reduces the possibility of solder bridging that can occur in flip chip mounting processes. Die tilt and die slide defects are also greatly reduced or eliminated by use of the arrangements because the cavities 425 determine the thickness of the resulting solder joints.

In the example of FIG. 4A, the post connects 314 are shown electrically coupled to the same lead in the package substrate 459, which is an example lead 460 for a packaged device. Other leads in the packaged device may have only one or two post connect connections to the semiconductor die 102. Power and ground leads may have several post connect connections that are electrically coupled in parallel. Parallel post connects can increase current capacity, reduce resistance and increase performance. In some examples, the lead 460 forms a longitudinal rail running across a portion of the packaged device. For enhanced thermal dissipation, the bottom surface of the lead 460 can be exposed from a mold compound that will form the package body, and the lead 460 can act as a thermal pad. When a QFN package is mounted to a circuit board, the exposed surface of the lead 460 can be soldered to a thermal pad on a circuit board.

FIG. 4B illustrates, in a cross sectional view, a close up view of a post connect 314 extending from a proximate end on semiconductor die 102 to a distal end with solder joint 418 formed from solder at the distal end of the post connect. The solder joint 418 is formed in cavity 425, and the solder joint 418 bonds to the sides and bottom surface of the cavity 425. The cavity 425 is formed extending into the die side surface of the package substrate 459. In an example, the depth D of cavity 425 is greater than a minimum depth of 35 microns. The solder joint has a thickness T, which can be in an example about 10 microns-30 microns. The depth D should be greater than the thickness T and sufficient so that the solder joint 418 is contained within the cavity 425, advantageously this aspect of the arrangements prevents solder bridging, as the solder is not present on the die side surface of the package substrate 459.

In an example, the width W2 of the cavities 425 is greater than the width W1 of the post connects 314 by at least 20%. This larger width ensures that during assembly, when the semiconductor die 102 is mounted on the die side surface of the package substrate 459, the post connect 314 can be positioned extending into the cavity 425 without damage or mechanical interference between the elements. The width, diameter, and length of the post connect 314 and solder 418 can vary with the process used to form the post connects 314. In an example process, the post connects 314 have a height of about 50 microns above the semiconductor die 102, with width W1 in the range of 75-150 microns, and the post connects can be oval, round, square or columnar shapes. The width W2 of the cavities 425 will be larger than the width W1 by at least 20% to provide sufficient margins and ease of assembly.

Figure 5A:
FIGS. 5A-5C and FIGS. 5AA-5CC illustrate, in a series of cross-sectional views, steps for making package substrates for use with the arrangements.
Figure 5A:
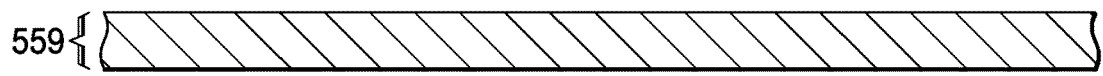
Figure 5B:
Figure 5B:
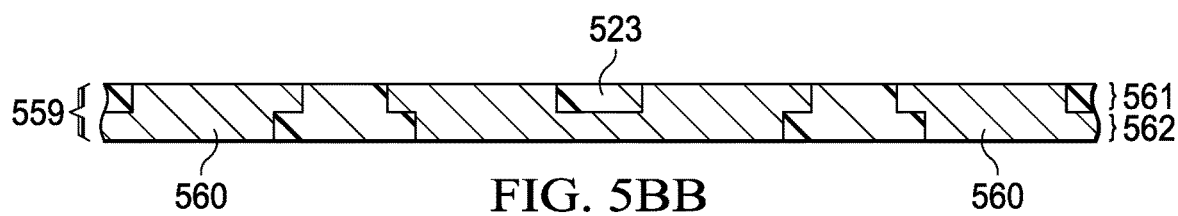
Figure 5C:
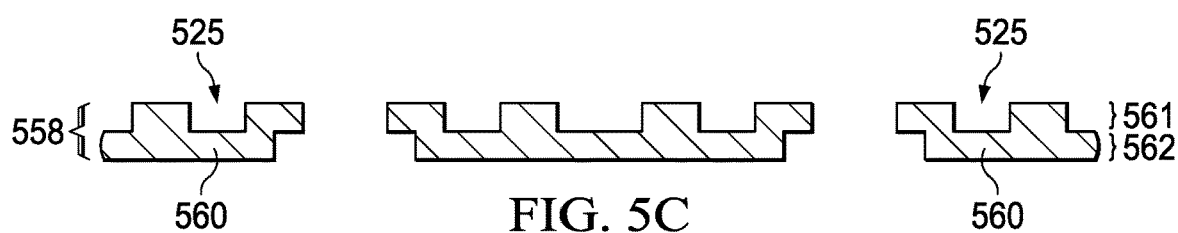
Figure 5C:
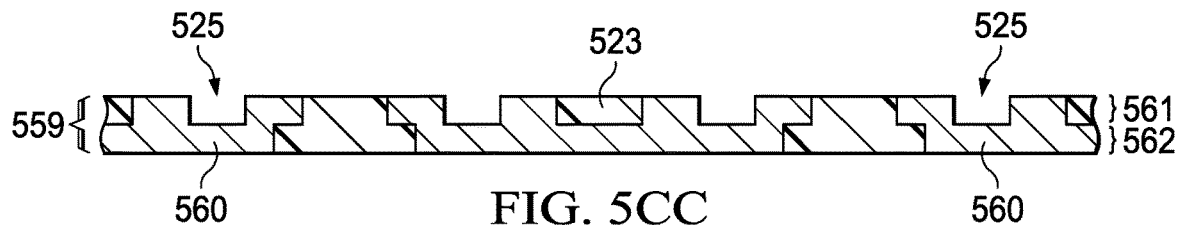

FIGS. 5A-5C and FIGS. 5AA-5CC illustrate, in a series of cross sections, selected steps for forming arrangements.

FIG. 5A illustrates in a cross section a package substrate 558. The package substrate 558 can be a sheet of conductive material. Copper and copper alloys can be used. Additional useful examples include Alloy 42, stainless steel, and steel. The surfaces of package substrate can be plated with layers (not shown) to enhance solderability and reduce tarnish or corrosion, examples include nickel, gold, silver, palladium, ENIG, and ENEPIG plating. Spot plating can be used.

FIG. 5AA illustrates in a cross section a package substrate 559, which is a starting material for a pre-molded lead frame (PMLF) package substrate for use in an arrangement. The package substrate 559 begins as a sheet of conductive material. Copper and copper alloys can be used. Additional useful examples include Alloy 42, stainless steel, and steel. The package substrate can be plated with layers (not shown) to enhance solderability and reduce tarnish or corrosion, examples include nickel, gold, silver, palladium, ENIG, and ENEPIG plating. Spot plating can be used.

FIG. 5B illustrates, in a cross section, the package substrate 558 of FIG. 5A after leads 560 are formed. In FIG. 5B, the package substrate 558 is patterned using a partial etch or half etch process. In a partial etch process, the package substrate is patterned by etching the package substrate 558 from both sides at different times. Partial etching allows openings to be formed between leads, and for an upper layer 561 to have a different pattern than a lower layer 562. In the examples shown here, no lead packages are formed, so that the leads 560 will not extend beyond a package boundary.

FIG. 5BB illustrates in a cross section an alternative approach using a PMLF. The package substrate 559 of FIG. 5AA is first patterned in a partial etch process as described with respect to FIG. 5B, and then the package substrate 559 is encapsulated with a mold compound 523 shown in FIG. 5BB. The mold compound 523 fills spaces between leads and fills recesses in the upper layer 561, and stiffens the package substrate 559. The mold compound 523 can be a thermoset epoxy resin that is deposited using transfer or block molding. Other resins and epoxies can be used for mold compound 523.

FIG. 5C illustrates in a cross section the partially etched package substrate 558 shown in FIG. 5B after cavities 525 are formed in the leads in the upper layer 561. The cavities 525 are formed at locations that correspond to post connects for a semiconductor die (not shown) that is to be mounted on the package substrate 558. In an example process, the cavities 525 can be formed by laser ablation, where a laser is focused on a spot on the upper surface of the package substrate 558 where a cavity is to be formed, and pulsed laser energy is applied to remove material until the desired depth is reached. The cavities 525 are sized to have a diameter larger than the diameter of a post connect to be mounted in the cavities, so that the post connect can easily be positioned in the cavities. The cavities are sized so that the solder bump at the distal end of a post connect is placed within the cavities, and the solder of the solder joints that are formed are contained within the cavities. In an alternative process, the cavities can be formed by mechanical drilling.

FIG. 5CC illustrates, in a cross section, the package substrate 559 of FIG. 5BB after the cavities 525 are formed in an upper surface of the package substrate. The package substrate 559 with upper layer 561 and lower layer 562 has mold compound 523 formed in spaces and recesses between leads 560, as shown in FIG. 5BB. Cavities 525 are formed in locations that correspond to the post connects of a semiconductor die to be mounted (not shown). The cavities 525 are formed using laser ablation or mechanical drilling to a depth sufficient to contain a solder joint that will be formed in the cavities 525.

The package substrate 558 for the partially etched lead frame in FIG. 5C, or the package substrate 559 in FIG. 5CC for the PMLF, can be used to form flip chip semiconductor device packages using semiconductor dies with post connects.

Figure 6A:
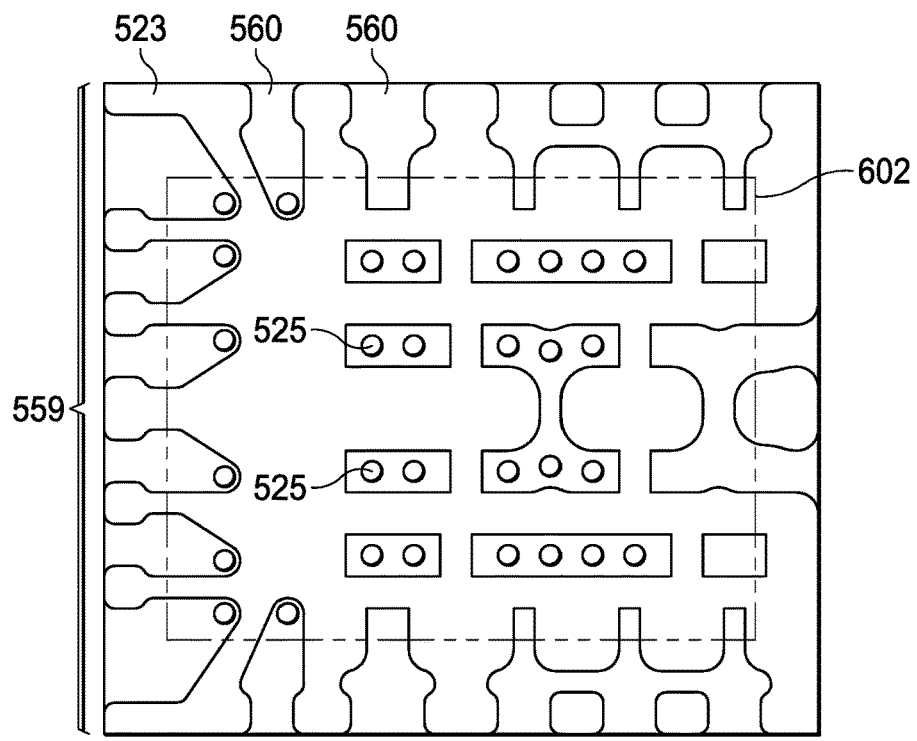
FIGS. 6A-B illustrate in a top plan view and a bottom plan view a package substrate for use in an arrangement.
Figure 6B:
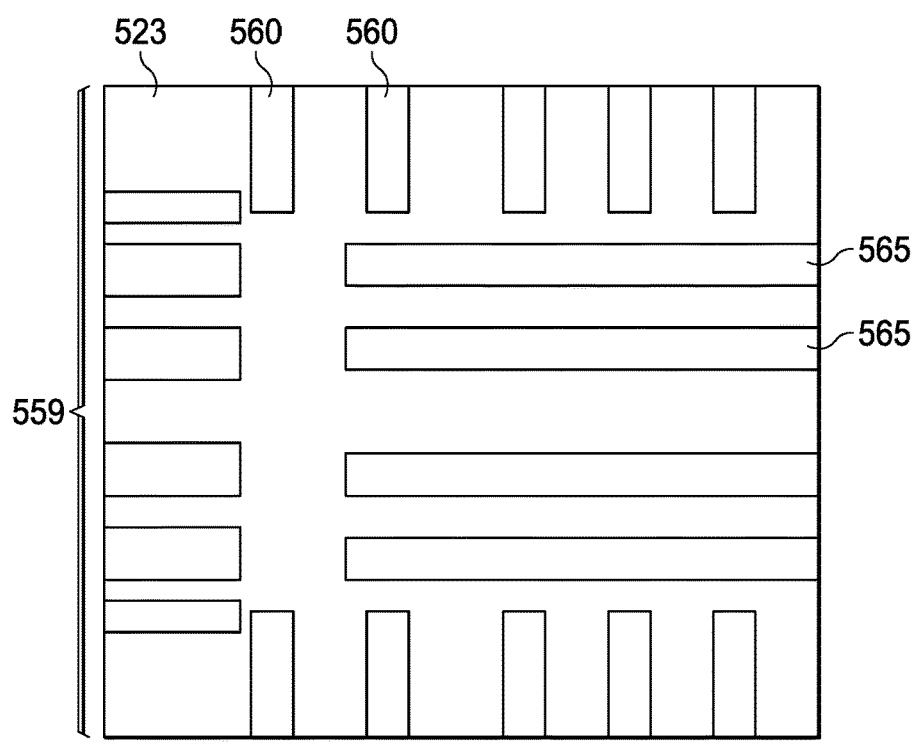

FIGS. 6A and 6B illustrate, in plan views, a die side surface and a board side surface, respectively, of an arrangement using a PMLF package substrate 559. In FIG. 6A, a plan view illustrates a die side surface of a package substrate 559, which is a PMLF package substrate as shown in FIG. 5CC. Cavities 525 are formed in the leads 560 at locations that correspond to post connects for a semiconductor die 602, shown in a dashed outline, that will be mounted to the package substrate. Mold compound 523 fills spaces and recesses between the leads 560 to stiffen the PMLF. As shown in FIG. 6A, in some locations multiple cavities 525 are formed on a lead 560, while in other locations only one cavity 525 is formed on a lead 560, corresponding to the pattern of the post connects on the semiconductor die 502.

In FIG. 6B, the board side surface of the package substrate 559, which is the opposite side from the die side surface shown in FIG. 6A, is shown in a plan view. Mold compound 523 is shown with leads 560 spaced from one another. The leads 560 form terminals for a semiconductor die to be mounted on the package substrate 558. Some leads 565 form rails or appear as stripes with surfaces exposed from the mold compound 523, and these leads 565 can form low resistance paths for power and ground terminals, and/or can add thermal dissipation paths for the packaged semiconductor device.

Figure 7A:
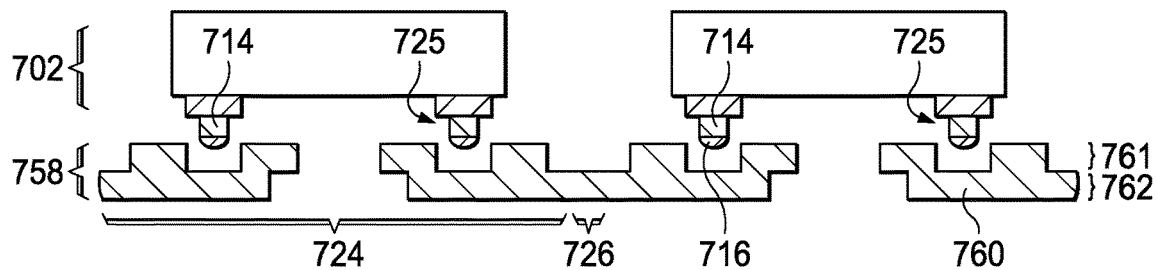
FIGS. 7A-7D illustrate, in a series of cross sectional views, steps for assembling a semiconductor device package of an arrangement.

FIGS. 7A-7D illustrate, in a series of cross sectional views, a method for assembling a packaged semiconductor device using the arrangements. In FIG. 7A, a cross sectional view illustrates a package substrate 758. Unit lead frames 724 are spaced by saw streets 726 that are designated areas between the unit lead frames. The unit lead frames 724 can be provided in a strip or in an array of rows and columns, and the package substrate 758 can include tens, hundreds or more unit lead frames 724 in a panel. Semiconductor dies 702 have post connects 714 with solder bumps 716 at distal ends of the post connects 714. Leads 760 are shown with cavities 725 formed in the die side surface of the package substrate 758. The cavities 725 have a depth that is sufficient to contain the solder bumps 716 when the post connects 714 are positioned in the cavities 725. As shown in FIG. 7A, the semiconductor dies 702 are positioned with the device side surfaces facing the package substrate 758, and the semiconductor dies are placed with the post connects 714 in the cavities 725. Because the solder bumps 716 and the post connects 714 are placed in corresponding cavities 725, the semiconductor dies 702 are aligned, and die misalignment problems observed in flip chip packages made without the arrangements are reduced or eliminated when the package substrates of the arrangements are used.

Figure 7B:
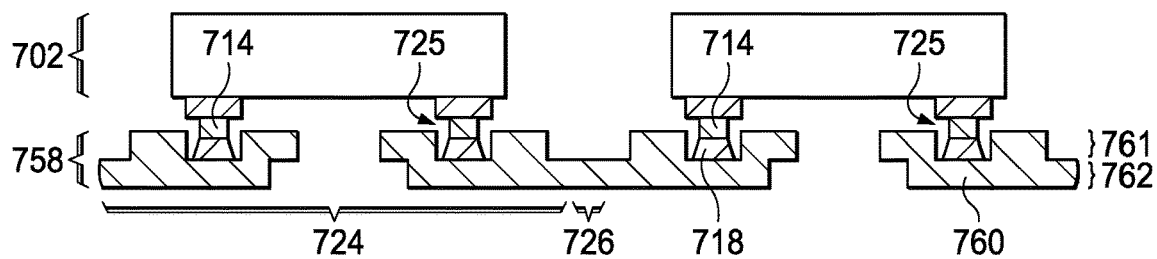

FIG. 7B illustrates the package substrate 758 in cross section after a thermal reflow process forms solder joints. In FIG. 7B, solder joints 718 are formed in the cavities 725 by a thermal process which heats the solder to a melting point, and then the solder flows to bond to the bottom and sides of the cavities 725 and hardens as it cools to form a solder joint between the post connect 714 and the cavities 725. The solder joints 718 are contained in the cavities 725, so that by use of the arrangements including the cavities 725 in the package substrate, the solder bridging problems observed in flip chip packages made without the arrangements are reduced or eliminated, as the solder joints 718 cannot form solder bridges, the solder is contained in the cavities 725.

Figure 7C:
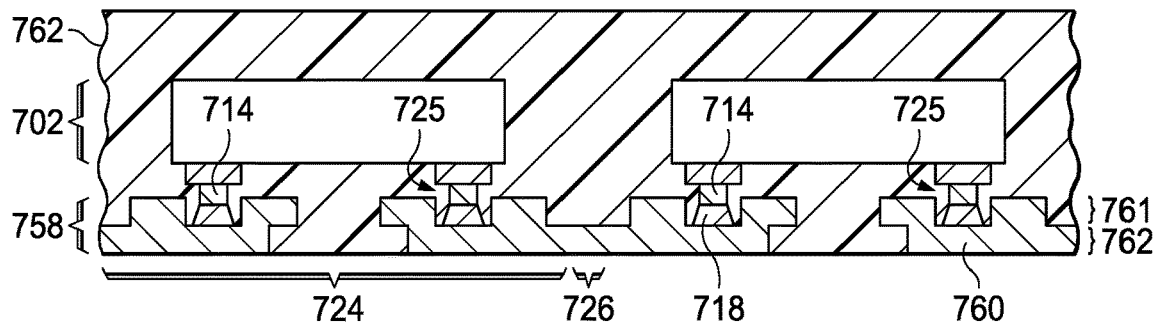

FIG. 7C illustrates in another cross sectional view the package substrate 758 of FIG. 7B after additional processing. In FIG. 7C, the semiconductor dies 702, the post connects 714, and the leads 760 are covered with mold compound 762. Portions of the leads 760 are exposed from the mold compound 762 to form terminals for the packaged semiconductor devices. The leads 760 end at the boundary of the mold compound 762, forming no leads packages. Mold compound 762 can be, in one example process, a thermoset mold compound. Transfer molding can be used where a solid pellet or powdered mold compound of resin epoxy is heated to a liquid state, forced through runners into a mold where the package substrate 758 with the semiconductor dies 702 is placed, and the mold compound is cured to a solid state. Alternative mold compounds such as resins and epoxies can be used. The mold compound can include fillers such as thermally conductive particles to increase the performance of the packages.

Figure 7D:
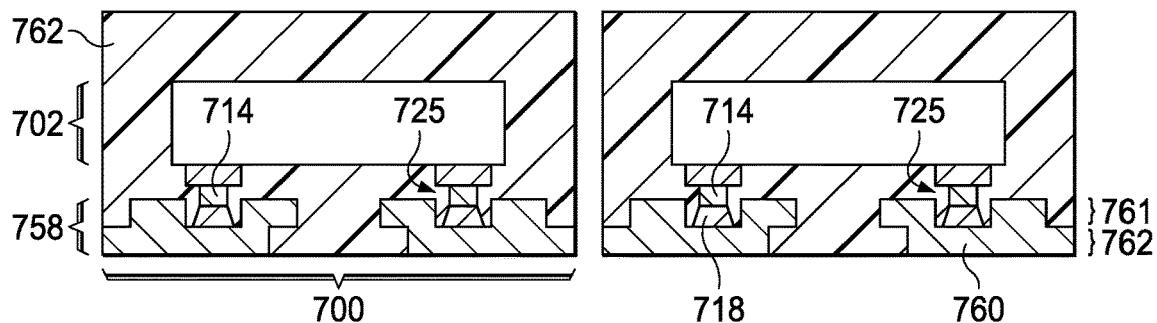

FIG. 7D illustrates in another cross section the package substrate 758 after additional processes. In FIG. 7D, packaged semiconductor devices 700 are shown after a sawing operation separates the packaged devices one from another along saw streets 724 in FIG. 7C. A mechanical saw cuts through the mold compound 762 and the package substrate 758 between unit devices 724 in FIG. 7C to form completed packaged semiconductor devices 700. The packaged semiconductor devices include the cavities 725 containing the solder joints 718, and the problems of die tilt, die misalignment and solder bridging that occur in flip chip packages made without the arrangements are eliminated or reduced by use of the arrangements.

FIGS. 8A-8D illustrate, in a series of cross sections, a method for forming a flip chip package using the PMLF package substrates of the arrangements.

Figure 8A:
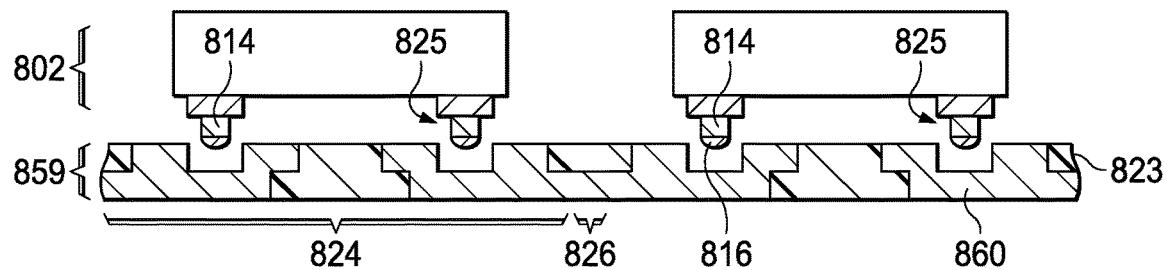
FIGS. 8A-8D illustrate, in a series of cross sectional views, steps for assembling a semiconductor device package in an alternative arrangement.

In FIG. 8A, a PMLF package substrate is shown in cross section with semiconductor dies 802 being mounted on a die side surface of unit lead frames 824 spaced by saw streets 826. Cavities 825 are formed on the die side surface of the package substrate 859. The semiconductor dies 802 are positioned with the post connects 814 extending into the cavities 825 and solder bumps 816 positioned within the cavities 825.

Figure 8B:
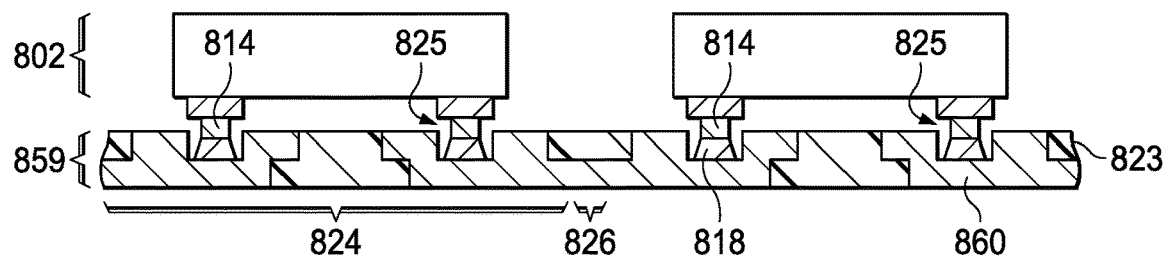

In FIG. 8B, the PMLF package substrate 859 of FIG. 8A is shown after additional processing. In FIG. 8B, solder joints 818 are formed in the cavities 825 by a thermal reflow process. In an example process, the solder bumps 816 (see FIG. 8A) are heated to a liquid state and flow into the cavities 825, bonding to a bottom surface and the sides of the cavities 825, forming a solder joint 818 between the post connects 814 and the leads 860 of the package substrate 859.

The use of the cavities 825 in the package substrate 859 positions the post connects 814 with the cavities 825 in the package substrate, preventing die misalignment, while the solder in the solder joints 818 is contained within the die cavities 825, so that problems of solder bridging and die tilt that can occur when flip chip packages are assembled without the use of the arrangements are advantageously eliminated or reduced.

Figure 8C:
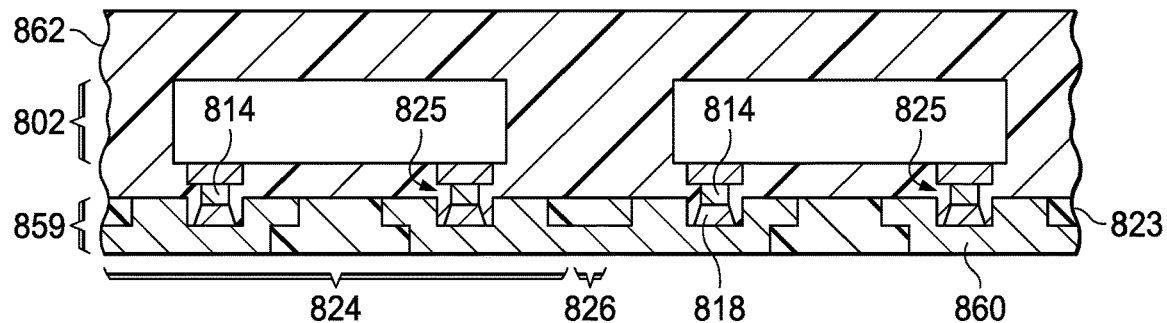

In FIG. 8C, the PMLF package substrate 859 is shown in a cross sectional view after additional processing. In FIG. 8C, mold compound 862 is shown formed over the semiconductor dies 802, and the die side surface of the PMLF package substrate 859. The mold compound in an example process is formed by a transfer molding operation using a thermoset epoxy resin mold compound. The mold compound 862 is deposited over the semiconductor dies 802 on the unit lead frames 824, and the packages can be described as an "overmolded" package.

Figure 8D:
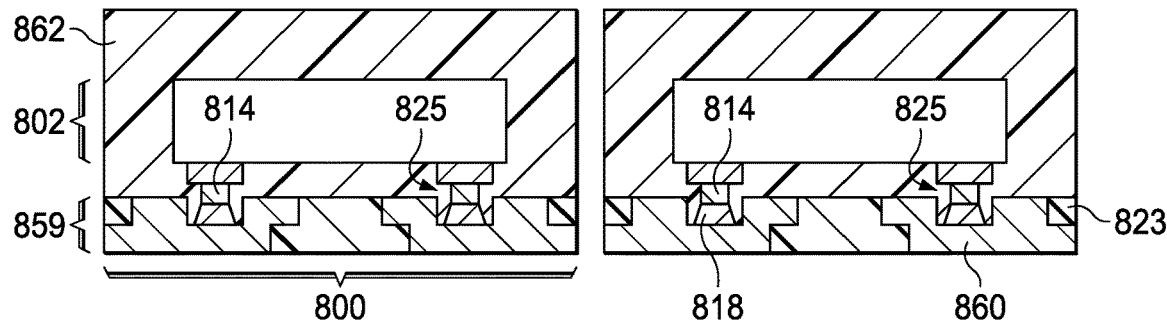

In FIG. 8D, the PMLF package substrate 859 is shown after additional processing. The unit lead frames 824 in FIG. 8C are separated by being sawn apart along saw streets 826 by mechanical sawing. The package substrate 859 and the mold compound 862 are cut along the saw streets 826 to form completed packaged semiconductor devices 800. The packaged semiconductor devices 800 include the cavities 825 formed in the leads 860, and the solder joints 818 are formed within the cavities, so that the solder joints are contained within the cavities 825. Solder bridges and die tilt problems that occur when flip chip packaged devices are formed without the use of the arrangement are eliminated or reduced by use of the arrangements.

Figure 9A:
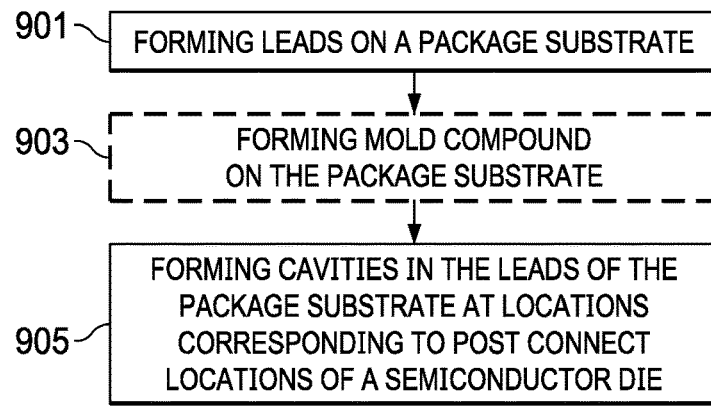
FIGS. 9A-9B illustrate in flow diagrams steps of method arrangements.
Figure 9B:
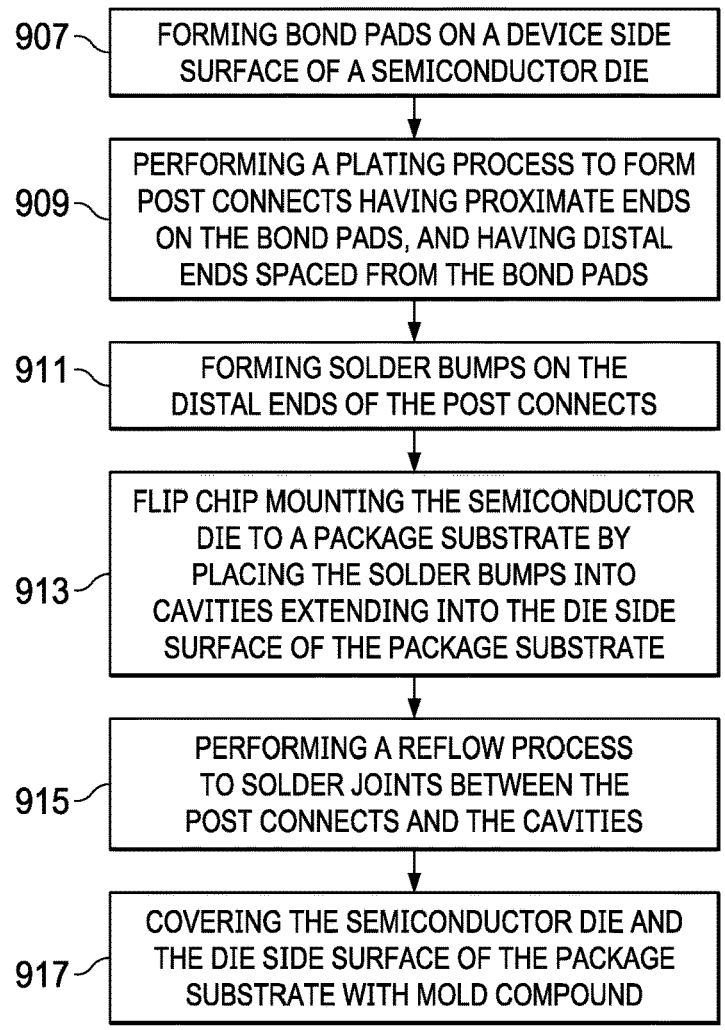

FIG. 9A illustrates, in a flow diagram, steps for forming a package substrate for use with the arrangements. FIG. 9B illustrates, in another flow diagram, steps for forming a flip chip semiconductor device package using the package substrate of the arrangements.

In FIG. 9A, at step 901, leads are formed on a package substrate (see, for example, FIG. 5B). The leads can be formed by stamping, or etch, in FIG. 5B, a partially etched lead frame is shown.

In FIG. 9A, step 903 is shown as an optional step. In step 903, mold compound is formed on the package substrate, this forms a pre-molded lead frame (see FIG. 5BB).

At step 905, cavities are formed in the leads of the package substrate at locations corresponding to post connect locations for a semiconductor die (see FIGS. 5C, and 5CC). The cavities can be formed by laser ablation, or by mechanical drilling.

The steps of FIG. 9A form a package substrate with cavities on a die side surface. These steps can be formed by a package substrate manufacturer independently of forming the semiconductor die and post connects, as shown in FIG. 9B, and then the completed semiconductor die can be mounted to the package substrate using the cavities.

In FIG. 9B, the method begins at step 907. Bond pads are formed on the device side surface of a semiconductor die. At step 909, a plating process is performed to form post connects having proximate ends on the bond pads and having distal ends spaced from the bond pads. (See FIGS. 2A-2B, and 3A).

At step 911, solder bumps are formed on the distal ends of the post connects. (See FIG. 3B). The steps 907, 909, 911 of FIG. 9B can be done at the wafer level, and then the semiconductor dies can be separated from the wafer (see FIG. 2B).

At step 913, the semiconductor dies are flip chip mounted to a package substrate with cavities on the device side surface, formed in the method shown in FIG. 9A, by positioning the semiconductor die so that the solder bumps are positioned in the cavities extending into the die side surface of the package substrate. (See FIGS. 7A, 8A).

At step 915, the method continues by performing a thermal reflow process to form solder joints between the post connects and the cavities. (See FIGS. 7B, 8B).

At step 917, the method continues by forming mold compound formed covering the semiconductor die and the die side surface of the package substrate with mold compound (see FIGS. 7C, 8C).

Use of the arrangements provides improved flip chip semiconductor device packages with reduced or eliminated solder bridging, die tilt, and die misalignment defects. The cavities in the package substrates at locations corresponding to the post connects align the semiconductor dies during thermal reflow of the solder bumps, preventing misalignment. The cavities contain the solder of the solder joints, preventing solder bridging, and ensuring bond line thickness uniformity. Other than forming the cavities, the use of the arrangements does not require any new or additional materials or tools.

Modifications are possible in the described arrangements, and other alternative arrangements are possible within the scope of the claims.

What is claimed is:

1. A method of manufacturing a semiconductor package, comprising:
    forming bond pads over a device side surface of a semiconductor die;
    performing a plating process to form post connects having proximate ends on the bond pads, and extending away from the bond pad to distal ends;
    forming solder bumps on the distal ends of the post connects;
    flip chip mounting the semiconductor die to a die side surface of a package substrate by bringing the solder bumps on the distal ends of the post connects into cavities extending into the die side surface of the package substrate, wherein the distal ends of the post connects extends into the cavities on the package substrate; and
    performing a thermal reflow to form solder joints between the post connects and the cavities in the package substrate.

2. The method of claim 1, wherein the post connects comprise copper or gold.

3. The method of claim 1, wherein the package substrate comprises a pre-molded lead frame.

4. The method of claim 1, wherein the package substrate comprises a partially etched metal lead frame.

5. The method of claim 1, wherein the package substrate comprises a metal lead frame that is copper, alloy 42, stainless steel, or steel.

6. The method of claim 1, wherein flip chip mounting the semiconductor die to a package substrate further comprises, prior to the flip chip mounting:
    forming the cavities on a device side surface of the package substrate, the cavities having sides in the package substrate and extending into the device side surface to a bottom surface in the package substrate, the cavities having a depth of at least 35 microns.

7. The method of claim 6, wherein forming the cavities comprises performing laser ablation on the package substrate.

8. The method of claim 6, wherein forming the cavities comprises performing mechanical drilling on the package substrate.

9. The method of claim 6, wherein the cavities are formed at locations corresponding to the locations of post connects on the semiconductor die.

10. The method of claim 6, wherein the solder joints are formed at the bottom of the cavities and the sides of the cavities, the solder joints contained within the cavities.

11. The method of claim 1 and further comprising:
covering the semiconductor die and the die side surface of the package substrate with mold compound.

12. An apparatus, comprising:
a package substrate for mounting a semiconductor die to a die side surface, the package substrate comprising leads spaced from one another; and
cavities extending into the leads from the die side surface, the cavities having sides and a bottom surface of the lead material, the cavities at locations corresponding to post connect locations on the semiconductor die, wherein the cavities have a depth extending into the package substrate from the die side surface that is greater than a thickness of solder on the distal ends of the post connect.

13. The apparatus of claim 12, wherein the package substrate comprises a metal lead frame.

14. The apparatus of claim 12, wherein the package substrate comprises a partially etched metal lead frame.

15. The apparatus of claim 12, wherein the package substrate comprises a pre-molded lead frame.

16. The apparatus of claim 12 and further comprising:
the semiconductor die having post connects extending from a proximal end on bond pads on the semiconductor die to distal ends spaced from the semiconductor die, the post connects having the solder deposited on the distal ends, the semiconductor die mounted on the package substrate by solder joints formed in the cavities on the package substrate.

17. The apparatus of claim 16, wherein the cavities have a depth that is greater than 35 microns.

18. A packaged semiconductor device, comprising:
a package substrate having a die side surface and an opposing board side surface;
leads in the package substrate spaced from one another;
cavities extending into the leads from the die side surface of the leads in the package substrate, the cavities having sides and a bottom surface of the lead material;
a semiconductor die flip chip mounted to the die side surface of the package substrate, the semiconductor die comprising post connects extending from bond pads on a device side of the semiconductor die, the post connects on the bond pads at a proximal end and extending to a distal end spaced from the bond pads, the post connects bonded to the leads on the package substrate by solder joints formed in the cavities, wherein the solder joints have a thickness, and the cavities have a depth greater than the thickness.

19. The packaged semiconductor device of claim 18, and further comprising:
mold compound covering the semiconductor die and the die side surface of the package substrate.

20. The packaged semiconductor device of claim 18, wherein the post connects have a first width, and the cavities have a second width that is greater than the first width by at least 20% of the first width.

21. The packaged semiconductor device of claim 18, wherein the cavities have a depth that is at least 35 microns from the die side surface of the package substrate.

22. The packaged semiconductor device of claim 18, wherein the package substrate is a partially etched metal lead frame.

23. The packaged semiconductor device of claim 18, wherein the package substrate is a pre-molded lead frame.

24. The packaged semiconductor device of claim 19, wherein the packaged semiconductor device is a quad flat no lead (QFN) package.

* * * * *